United States Patent
Tian et al.

(10) Patent No.: US 9,490,789 B1
(45) Date of Patent: Nov. 8, 2016

(54) GLITCH-FREE CLOCK SWITCHING CIRCUIT USING MULLER C-ELEMENTS

(71) Applicant: FREESCALE SEMICONDUCTOR, INC., Austin, TX (US)

(72) Inventors: Chaoxuan Tian, Suzhou (CN); Zhihong Cheng, Suzhou (CN); Zhiling Sui, Suzhou (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 15/139,337

(22) Filed: Apr. 27, 2016

(51) Int. Cl.
| | |
|---|---|
| H03K 19/00 | (2006.01) |
| H03K 5/135 | (2006.01) |
| H03K 19/20 | (2006.01) |
| H03K 19/003 | (2006.01) |
| H03K 19/096 | (2006.01) |
| H03K 5/00 | (2006.01) |

(52) U.S. Cl.
CPC ........ *H03K 5/135* (2013.01); *H03K 19/00315* (2013.01); *H03K 19/096* (2013.01); *H03K 19/20* (2013.01); *H03K 2005/00013* (2013.01)

(58) Field of Classification Search
CPC ........... H03K 5/135; H03K 19/00315; H03K 19/096; H03K 19/20; H03K 2005/00013
USPC .......... 326/93–98; 327/40–43, 141, 142, 144
See application file for complete search history.

(56) References Cited

U.S. PATENT DOCUMENTS

| | | | |
|---|---|---|---|
| 5,231,636 A | 7/1993 | Rasmussen | |
| 5,646,554 A | 7/1997 | Kim | |
| 6,239,626 B1 | 5/2001 | Chesavage | |
| 6,341,355 B1 | 1/2002 | Rutherford | |
| 6,501,304 B1 | 12/2002 | Boerstler | |
| 6,563,349 B2 | 5/2003 | Mavila | |
| 6,600,345 B1 | 7/2003 | Boutaud | |
| 6,806,755 B1 | 10/2004 | Simmonds | |
| 6,975,145 B1 | 12/2005 | Vadi | |
| 7,046,047 B2 | 5/2006 | Daijo | |
| 7,427,881 B2 | 9/2008 | Starr | |
| 7,579,895 B2 | 8/2009 | Sun | |
| 7,629,828 B1 | 12/2009 | Nekl | |
| 7,679,048 B1 | 3/2010 | Aziz | |
| 8,086,989 B2 | 12/2011 | Hailu | |
| 8,350,600 B2 | 1/2013 | Leon | |
| 8,570,069 B2 | 10/2013 | Zid | |
| 8,860,468 B1 | 10/2014 | Khandelwal | |
| 2008/0284484 A1 | 11/2008 | Lou | |

(Continued)

OTHER PUBLICATIONS

Mahmud, Rafey, "Techniques to make clock switching glitch free," EE Times Jun. 26, 2003 (http://www.eetimes.com/story/OEG20030626S0035).

*Primary Examiner* — Alexander H Taningco
*Assistant Examiner* — Seokjin Kim
(74) *Attorney, Agent, or Firm* — Charles E. Bergere

(57) ABSTRACT

A clock switching circuit includes first and second clock lines, first and second selection lines, and first through fourth Muller C-elements. The Muller C-elements are connected to the clock and selection lines and first and second logic gates. First and second delay cells are connected to the clock lines and the second and fourth Muller C-elements. A first AND gate is connected to the first clock line, the first Muller C-element, and the first delay cell. A second AND gate is connected to the second delay cell, the third Muller C-element, and the second clock line, and an OR gate is connected to the first and second AND gates.

10 Claims, 3 Drawing Sheets

(56) References Cited

U.S. PATENT DOCUMENTS

| | | |
|---|---|---|
| 2008/0309393 A1 | 12/2008 | Sun |
| 2009/0016049 A1 | 1/2009 | Hedrick |
| 2009/0016495 A1 | 1/2009 | Malas |
| 2009/0039940 A1 | 2/2009 | Hong |
| 2010/0001767 A1 | 1/2010 | Shikata |
| 2012/0268168 A1* | 10/2012 | Zid .......................... G06F 1/10 326/93 |
| 2014/0118033 A1 | 5/2014 | Anker |
| 2014/0320170 A1* | 10/2014 | Rooks ................ H03K 19/0016 326/93 |

\* cited by examiner

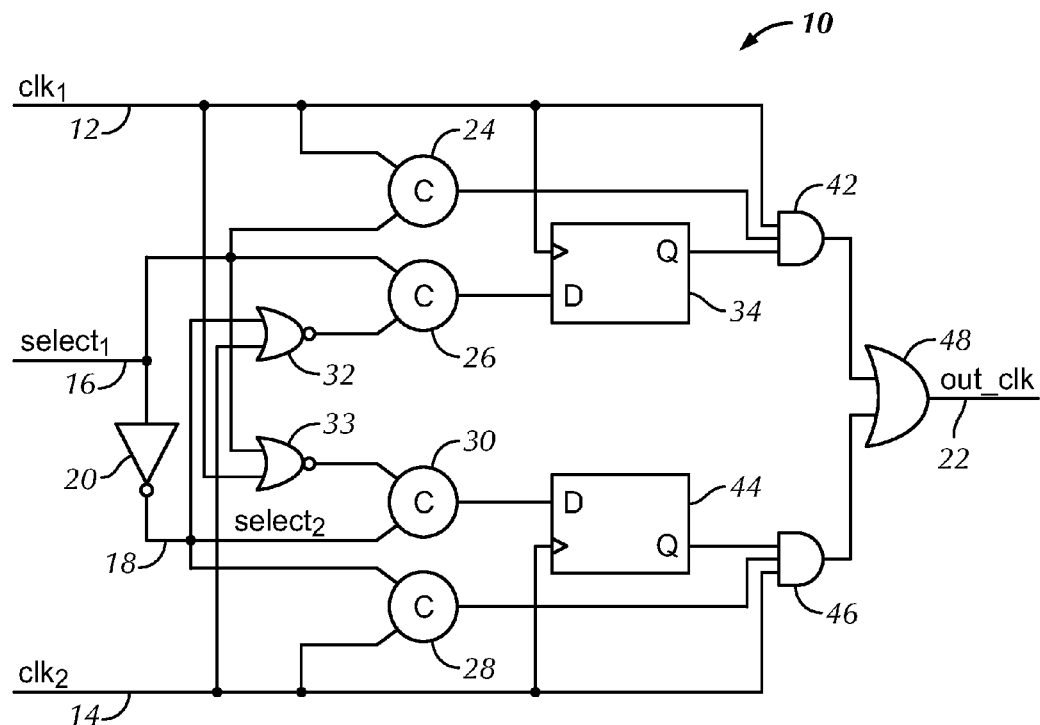
*FIG. 1*
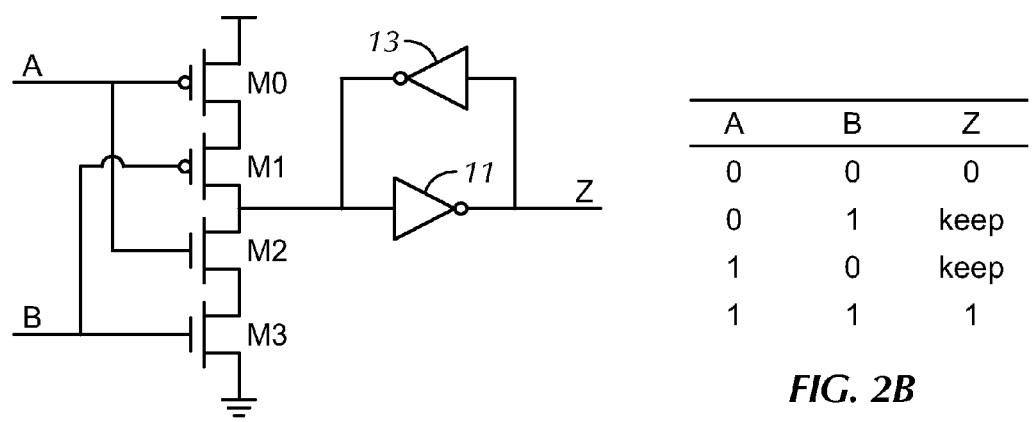
*FIG. 2A*
| A | B | Z |
|---|---|---|
| 0 | 0 | 0 |
| 0 | 1 | keep |
| 1 | 0 | keep |
| 1 | 1 | 1 |
*FIG. 2B*

GLITCH-FREE CLOCK SWITCHING CIRCUIT USING MULLER C-ELEMENTS

BACKGROUND

The present invention is directed to integrated circuit components and, more particularly, to a clock-switching circuit that uses Muller C-elements.

In integrated circuits (ICs) with multiple clocks, a switching circuit is provided. Most conventional switching circuits include a plurality of flip-flops, which consume a large area of the circuit board (or chip area) in the form of transistors. In addition, such circuits typically are unable to accomplish switching functions when one of the clocks has stopped.

It is therefore desirable to provide a clock switching circuit that uses fewer transistors, thereby consuming less space, can accomplish switching even when one of the clocks has stopped, and is easily expandable to accommodate more clocks.

BRIEF DESCRIPTION OF THE SEVERAL VIEWS OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings:

FIG. 1 is a schematic circuit diagram of a clock switching circuit in accordance with a first preferred embodiment of the present invention;

FIG. 2A is a schematic circuit diagram of a conventional Muller C-element;

FIG. 2B is a table of logic values applicable to the Muller C-element in FIG. 2A;

DETAILED DESCRIPTION

In one embodiment, the present invention provides a clock switching circuit including a first clock line providing a first clock signal, a second clock line providing a second clock signal, a first selection line providing a first selection signal, a second selection line providing a second selection signal, a first Muller C-element connected at its inputs to the first clock line and the first selection line, a second Muller C-element connected at its inputs to the first selection line and an output of a first logic gate, a third Muller C-element connected at its inputs to the second selection line and an output of a second logic gate, a fourth Muller C-element connected at its inputs to the second selection line and the second clock line, a first delay cell connected at its inputs to the first clock line and an output of the second Muller C-element, a second delay cell connected at its inputs to an output of the third Muller C-element and the second clock line, a first AND gate connected at its inputs to the first clock line, an output of the first Muller C-element, and an output of the first delay cell, a second AND gate connected at its inputs to an output of the second delay cell, an output of the fourth Muller C-element, and the second clock line, and an OR gate connected at its inputs to outputs of the first and second AND gates and providing an output clock signal at its output. The first selection signal is used to select the first clock signal as the output clock signal and the second selection signal is used to select the second clock signal as the output clock signal.

In another embodiment, the present invention provides a clock switching circuit including a plurality of clock lines, each providing a respective clock signal, an OR gate providing an output clock signal, a plurality of selection lines, each corresponding to a respective one of the plurality of clock lines and providing a selection signal used for selecting a corresponding clock signal as the output clock signal, and a plurality of clock selection modules. Each clock selection module includes a first Muller C-element having its inputs connected to a corresponding clock line and corresponding selection line, and a second Muller C-element having its inputs connected to the corresponding selection line and an output of a first AND gate. The first AND gate has one input connected to the corresponding selection line and receives at another input an inverted value of the output of the OR gate. A delay cell has its inputs connected to the corresponding clock line and an output of the second Muller C-element. A second AND gate has its inputs connected to the corresponding clock line, an output of the first Muller C-element, and an output of the delay cell. An output of the second AND gate is connected to an input of the OR gate.

Figure 5:
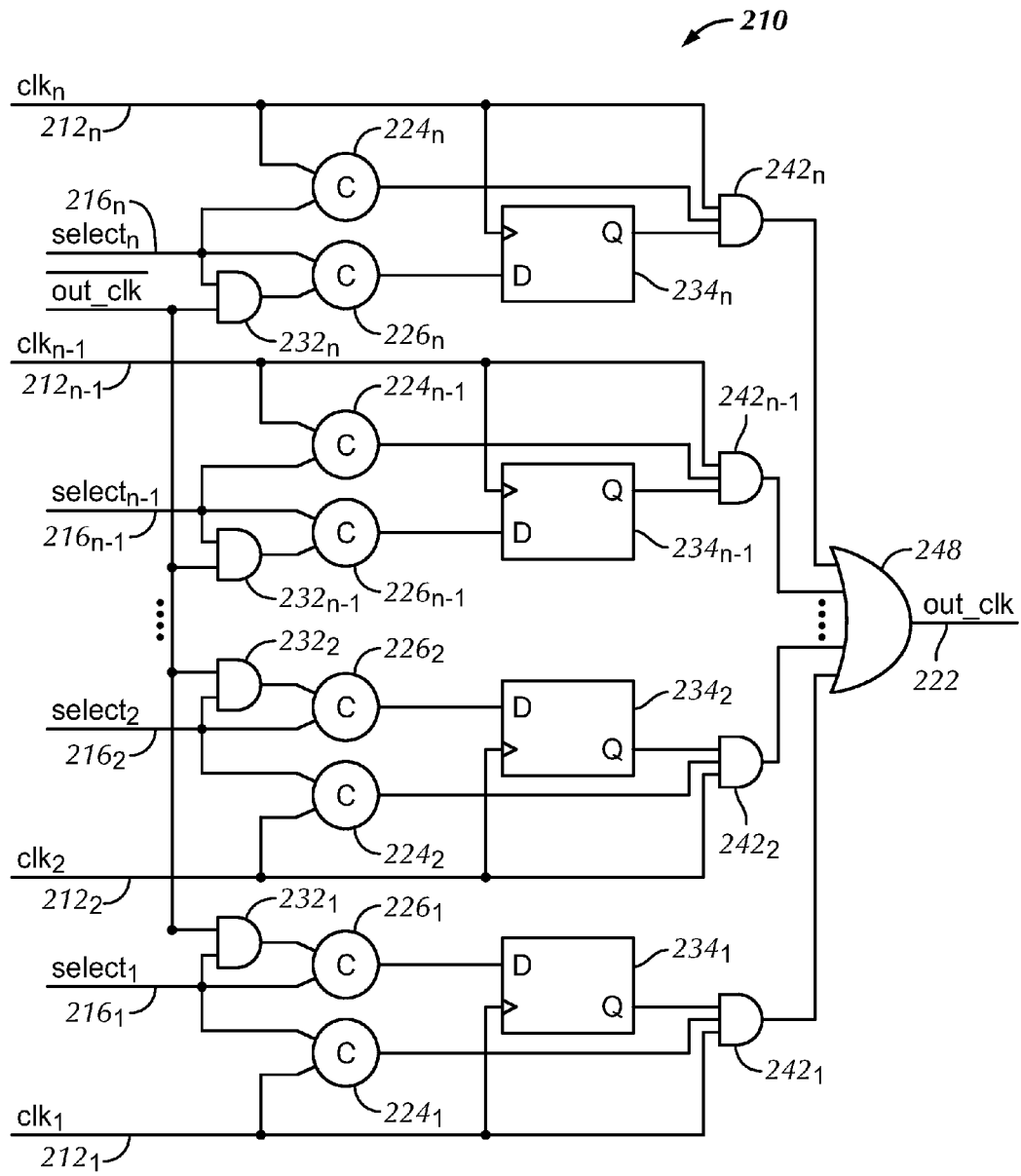
FIG. 5 is a schematic circuit diagram of a clock switching circuit in accordance with a third preferred embodiment of the present invention.

Referring now to the drawings, wherein the same reference numerals are used to designate the same components throughout the several figures, there is shown in FIG. 1 a first embodiment of a clock switching circuit 10 in accordance with the present invention. The circuit 10 in FIG. 1 includes a first clock line 12 and a second clock line 14, which respectively provide first and second clock signals $clk_1$, $clk_2$. However, it is understood that the circuit 10 can include more than two clock lines, such as shown in FIG. 5.

The circuit 10 further includes a first selection line 16 and a second selection line 18, which respectively provide first and second selection signals $select_1$, $select_2$. In the embodiment shown in FIG. 1, the second selection line 18 is an output of an inverter 20 that connects at its input to the first selection line 16. Thus, the second selection signal $select_2$ in the embodiment shown is an inverted form of the first selection signal $select_1$. However, this configuration can be reversed, or the first and second selection signals $select_1$, $select_2$ may be separate and independent signals. The first and second selection signals $select_1$, $select_2$ are used to select the corresponding first or second clock signal $clk_1$, $clk_2$ for use as an output clock signal out_clk at an output 22 of the circuit 10.

The circuit 10 further includes a plurality of Muller C-elements 24, 26, 28, 30. A conventional Muller C-element design is shown in FIG. 2A. The Muller C-element receives two inputs A, B, which are both fed to respective p-type metal-oxide-semiconductor (PMOS) transistors M0, M1 forming a pull-up network and respective n-type (NMOS) transistors M2, M3 forming a pull-down network. The node between the networks outputs to a latch having an inverter 11 that is coupled to an output Z of the Muller C-element and is connected in parallel with a weak inverter 13. However, other designs for the Muller C-element are possible in keeping with the invention, including designs having reset capabilities and the like.

FIG. 2B shows a conventional logic table for the inputs A, B and output Z of the Muller C-element. If the inputs A, B are both low, the output Z is also low. If the inputs A, B are both high, the output Z is also high. If the inputs A, B differ, the output Z is maintained at its current state.

Referring again to FIG. 1, the first Muller C-element 24 has its inputs connected to the first clock line 12 and to the first selection line 16. The second Muller C-element 26 has its inputs connected to the first selection line 16 and to an output of a first logic gate 32. In the embodiment shown in FIG. 1, the first logic gate 32 is preferably a NOR gate having its inputs connected to the second selection line 18 and the second clock line 14.

An output of the second Muller C-element 26 is connected to an input D of a first delay cell 34, which has its other input connected to the first clock line 12. The delay cell 34 can delay a rising edge of the signal received from the second Muller C-element 26 to a falling edge of the first clock signal $clk_1$.

Figure 3:
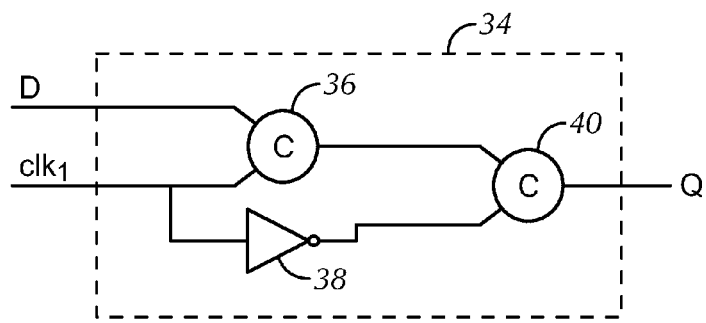
FIG. 3 is a schematic circuit diagram of a delay cell for use in the clock switching circuit of FIG. 1.

An exemplary embodiment of the first delay cell 34 is shown in FIG. 3. The first delay cell 34 preferably includes a first delay Muller C-element 36 having its inputs connected to the output of the second Muller C-element 26 and the first clock line 12. A delay inverter 38 of the first delay cell 34 also connects to the first clock line 12 at its input. The resulting outputs of the first delay Muller C-element 36 and the delay inverter 38 may be connected to the inputs of a second delay Muller C-element 40, an output of which serves as the output for the first delay cell 34.

A first AND gate 42 has its inputs connected to the first clock line 12, an output of the first Muller C-element 24, and the output of the first delay cell 34. Together, the first and second Muller C-elements 24, 26, the first logic gate 32, the first delay cell 34, and the first AND gate 42 preferably form a clock switching "module" for selecting the first clock signal $clk_1$.

A clock switching module for the second clock signal $clk_2$ is further provided in the circuit 10. The third Muller C-element 28 has its inputs connected to the second clock line 14 and to the second selection line 18. The fourth Muller C-element 30 has its inputs connected to the second selection line 18 and to an output of a second logic gate 33. As with the first logic gate 32, the second logic gate 33 in the present embodiment is preferably a NOR gate, although its inputs are connected to the first selection line 16 and the first clock line 12.

An output of the fourth Muller C-element 30 is connected to an input D of a second delay cell 44, which has its other input connected to the second clock line 14. The second delay cell 44 preferably has the same structure as the first delay cell 34, shown in FIG. 3. A second AND gate 46 has its inputs connected to the second clock line 14, an output of the third Muller C-element 28, and the output of the second delay cell 44. Outputs of the first and second AND gates 42, 46 are connected to inputs of an OR gate 48, which provides the output clock signal out_clk on the circuit output 22.

Figure 4:
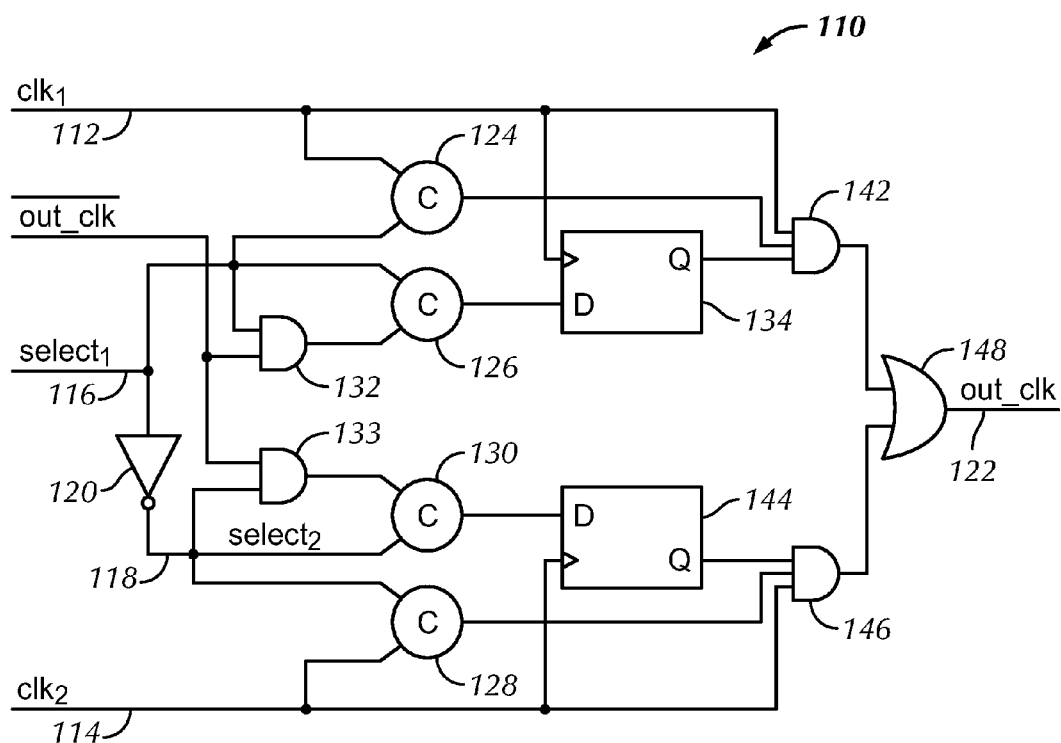
FIG. 4 is a schematic circuit diagram of a clock switching circuit in accordance with a second preferred embodiment of the present invention.

Referring now to FIG. 4, a second embodiment of the clock switching circuit is shown. The second embodiment is similar to the first embodiment described above. Like numerals have been used for like elements, except the 100 series numerals have been used for the second embodiment. Accordingly, a complete description of the second embodiment has been omitted, with only the differences being described.

In the embodiment of the clock switching circuit 110 shown in FIG. 4, the first logic gate 132 is an AND gate rather than the NOR gate shown in FIG. 1. The first logic gate 132 is connected to the first selection line 16 and also receives an inverted value of the output of the OR gate 122, meaning the logic comparison is made between the first selection signal select' and an inverted value of the output clock signal out_clk. Similarly, the second logic gate 133 is an AND gate having an input connected to the second selection line 118 and receiving at another input an inverted value of the output of the OR gate 122.

In both embodiments, the switching circuits 10, 110 use fewer transistors and occupy less area than traditional clock switching circuits using flip-flops.

Embodiments of the present invention also allow for expanding the clock switching circuit for use with a plurality of clock sources. For example, FIG. 5 shows a clock switching circuit 210 having n clock lines $212_1$-$212_n$ respectively providing n clock signals $clk_1$-$clk_n$. A plurality of selection lines $216_1$-$216_n$ are also provided to correspond to respective ones of the clock lines $212_1$-$212_n$ and are used for selecting the corresponding clock signal $clk_1$-$clk_n$ as the output clock signal out_clk at the output 222 of the circuit 210.

Each of the clock lines $212_1$-$212_n$ and corresponding selection lines $216_1$-$216_n$ is associated with one of a plurality of clock selection modules. As explained above, and with reference to the clock selection module associated with the $n^{th}$ clock line $212_n$, each clock selection module includes a first Muller C-element $224_n$ having its inputs connected to corresponding clock and selection lines $212_n$, $216_n$, and a second Muller C-element $226_n$ having its inputs connected to the corresponding selection line $216_n$ and an output of a first logic gate $232_n$ (preferably an AND gate having an input connected to the corresponding selection line $216_n$ and another input receiving an inverted value of the output of the OR gate 248). Each clock selection module also includes a delay cell $234_n$ having its inputs connected to the corresponding clock line $212_n$ and an output of the second Muller C-element $226_n$. The delay cell $234_n$ is preferably the same as that shown in FIG. 3. The clock selection modules also preferably include an AND gate $242_n$ having its inputs connected to the corresponding clock line $212_n$, an output of the first Muller C-element $224_n$, and an output of the delay cell $234_n$, and an output connected to an input of the OR gate 248.

In the foregoing specification, the invention has been described with reference to specific examples of embodiments of the invention. It will, however, be evident that various modifications and changes may be made therein without departing from the broader spirit and scope of the invention as set forth in the appended claims.

The connections discussed may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed. Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The switch elements are described in preferred embodiments as being transistors, but other types of switching circuitry, such as mechanical switches, relays, or the like, can also use these switching elements. In addition, while certain transistors are described as PMOS or NMOS type, the conductivities may be reversed in still keeping with the invention.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A clock switching circuit, comprising:
    first and second clock lines that provide first and second clock signals;
    first and second selection lines that provide first and second selection signals;
    a first Muller C-element connected at its inputs to the first clock line and the first selection line;
    a second Muller C-element connected at its inputs to the first selection line and an output of a first logic gate;
    a third Muller C-element connected at its inputs to the second selection line and the second clock line;
    a fourth Muller C-element connected at its inputs to the second selection line and an output of a second logic gate;
    a first delay cell connected at its inputs to the first clock line and an output of the second Muller C-element;
    a second delay cell connected at its inputs to an output of the fourth Muller C-element and the second clock line;
    a first AND gate connected at its inputs to the first clock line, an output of the first Muller C-element, and an output of the first delay cell;
    a second AND gate connected at its inputs to an output of the second delay cell, an output of the third Muller C-element, and the second clock line; and
    an OR gate connected at its inputs to outputs of the first and second AND gates and providing an output clock signal at its output, wherein the first selection signal is used to select the first clock signal as the output clock signal and the second selection signal is used to select the second clock signal as the output clock signal.

2. The clock switching circuit of claim 1, wherein:
    the first logic gate is an AND gate connected at one input to the first selection line and receives at another input an inverted value of the output of the OR gate, and
    the second logic gate is an AND gate connected at one input to the second selection line and receives at another input the inverted value of the output of the OR gate.

3. The clock switching circuit of claim 2, further comprising:
    a third clock line providing a third clock signal;
    a third selection line providing a third selection signal that is used to select the third clock signal as the output clock signal;
    a fifth Muller C-element connected at its inputs to the third clock line and the third selection line;
    a sixth Muller C-element connected at its inputs to the third selection line and an output of a third logic gate, the third logic gate being an AND gate connected at one input to the third selection line and receiving at another input the inverted value of the output of the OR gate;
    a third delay cell connected at its inputs to the third clock line and an output of the sixth Muller C-element; and
    a third AND gate connected at its inputs to the third clock line, an output of the fifth Muller C-element, and an output of the third delay cell, the third AND gate having an output connected to an input of the OR gate.

4. The clock switching circuit of claim 1, wherein the first delay cell includes:
    a first delay Muller C-element connected at its inputs to the output of the second Muller C-element and the first clock line, and
    a first delay inverter connected at its input to the first clock line, and
    the second delay cell includes:
    a second delay Muller C-element connected at its inputs to the output of the fourth Muller C-element and the second clock line, and
    a second delay inverter connected at its input to the second clock line.

5. The clock switching circuit of claim 4, wherein:
    the first delay cell further includes a third delay Muller C-element connected at its inputs to an output of the first delay Muller C-element and an output of the first delay inverter, and
    the second delay cell further includes a fourth delay Muller C-element connected at its inputs to an output of the second delay Muller C-element and an output of the second delay inverter.

6. The clock switching circuit of claim 1, wherein:
    the first logic gate is a NOR gate connected at its inputs to the second selection line and the second clock line, and
    the second logic gate is a NOR gate connected at its inputs to the first selection line and the first clock line.

7. The clock switching circuit of claim 1, wherein the second selection line is connected to an output of an inverter, the inverter being connected at its input to the first selection line.

8. A clock switching circuit, comprising:
a plurality of clock lines, each providing a respective clock signal;
an OR gate providing an output clock signal;
a plurality of selection lines, each corresponding to a respective one of the plurality of clock lines and providing a selection signal used for selecting a corresponding clock signal as the output clock signal; and
a plurality of clock selection modules, each of which includes:
- a first Muller C-element having its inputs connected to a corresponding clock line and corresponding selection line,
- a second Muller C-element having its inputs connected to the corresponding selection line and an output of a first AND gate, the first AND gate having one input connected to the corresponding selection line and receiving at another input an inverted value of the output of the OR gate,
- a delay cell having its inputs connected to the corresponding clock line and an output of the second Muller C-element, and
- a second AND gate having its inputs connected to the corresponding clock line, an output of the first Muller C-element, and an output of the delay cell, an output of the second AND gate being connected to an input of the OR gate.

9. The clock switching circuit of claim 8, wherein each delay cell includes:
- a first delay Muller C-element connected at its inputs to the output of the second Muller C-element and the corresponding clock line, and
- a first delay inverter connected at its input to the corresponding clock line.

10. The clock switching circuit of claim 9, wherein each delay cell further includes a second delay Muller C-element connected at its inputs to an output of the first delay Muller C-element and an output of the first delay inverter.

\* \* \* \* \*